United States Patent [19]

Hjulstrom

[11] Patent Number: 4,894,316

[45] Date of Patent: Jan. 16, 1990

[54] ADJUSTMENT OF THIN FILM CAPACITORS

[75] Inventor: Richard A. Hjulstrom, Kingston, N.Y.

[73] Assignee: Electro-Films, Inc., Warwick, R.I.

[21] Appl. No.: 210,034

[22] Filed: Jun. 22, 1988

[51] Int. Cl.$^4$ .............................................. G03C 5/00
[52] U.S. Cl. ................................. 430/316; 430/22; 430/318; 29/847
[58] Field of Search ................... 430/313, 318, 30, 22, 430/326; 29/847, 25.42

[56] References Cited

U.S. PATENT DOCUMENTS

| | | | |
|---|---|---|---|
| 3,864,825 | 2/1975 | Holmes | 29/621 |
| 3,867,193 | 2/1975 | Sumi | 204/38.3 |
| 3,869,367 | 3/1975 | Sato et al. | 204/192 |
| 3,896,284 | 7/1975 | Holmes | 338/48 |
| 3,988,824 | 11/1976 | Bodway | 437/60 |
| 3,996,502 | 12/1976 | Bratschun | 317/258 |
| 4,007,296 | 2/1977 | Ansell et al. | 427/79 |
| 4,190,854 | 2/1980 | Redfern | 357/51 |
| 4,240,127 | 12/1980 | Fanning et al. | 361/304 |
| 4,301,439 | 11/1981 | Johnson et al. | 338/195 |
| 4,338,506 | 7/1982 | Geller et al. | 219/121 |
| 4,352,145 | 9/1982 | Stockman | 361/329 |
| 4,427,457 | 1/1984 | Carlson et al. | 437/20 |
| 4,439,814 | 3/1984 | Rhodes | 361/321 |
| 4,453,199 | 6/1984 | Ritchie et al. | 361/306 |
| 4,470,096 | 9/1984 | Guertin | 361/277 |
| 4,604,513 | 8/1986 | Lim | 219/121 |

Primary Examiner—Jose G. Dees
Attorney, Agent, or Firm—Weingarten, Schurgin, Gagnebin & Hayes

[57] ABSTRACT

A system and method for adjusting the capacitance value of thin film capacitors during fabrication is provided. During formation of metal film capacitor plates on capacitor regions of a substrate, adjustment patterns comprised of multiple parallel adjustment lines corresponding to adjustment percentages of the capacitance value are formed in an area of the substrate adjacent to the capacitor regions. Selected adjustment lines of the adjustment patterns are offset aligned with corresponding lines of a photolithographic mask used during formation of the metal film capacitor plates in a re-etching process to selectively reduce the area of the capacitor plates to produce the desired decrease in capacitance value.

2 Claims, 4 Drawing Sheets

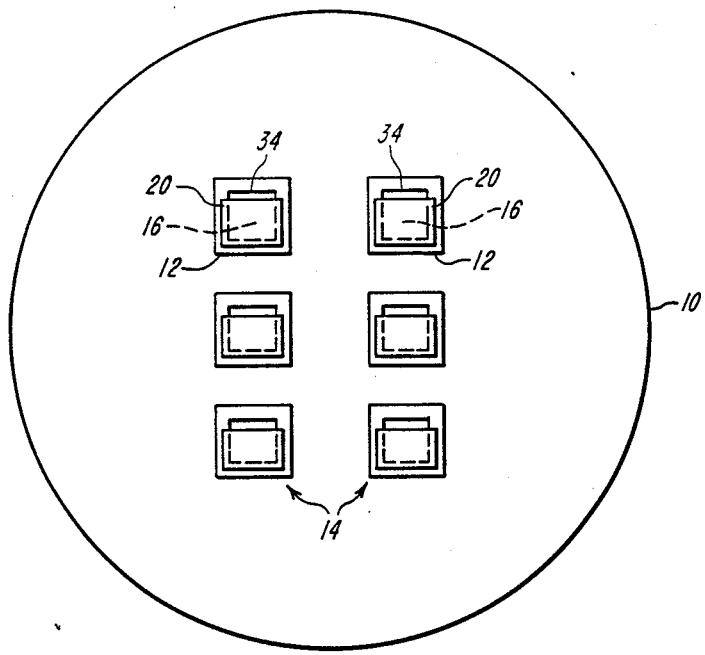
FIG. 5
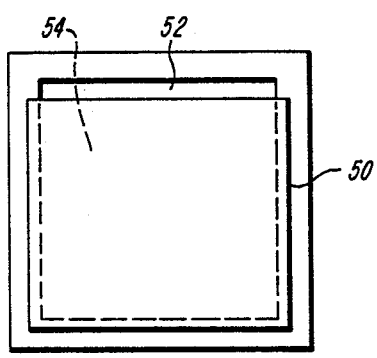 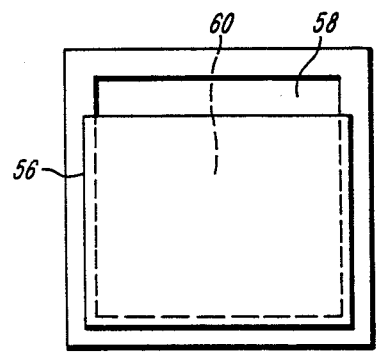
FIG. 7A  FIG. 7B

ADJUSTMENT OF THIN FILM CAPACITORS

FIELD OF THE INVENTION

This invention relates to thin film capacitors, and in particular to a method and apparatus for adjusting the capacitance value of thin film capacitors during fabrication.

BACKGROUND OF THE INVENTION

The value of a capacitor is determined by the dielectric constant of the dielectric material used in the capacitor, the thickness of the dielectric material, and the area of the capacitor plates confronting the dielectric material. For a given thickness of a particular dielectric material, a decrease in the effective area of the capacitor plates confronting the dielectric material will proportionally decrease the capacitance value of the capacitor.

At present it is possible to manufacture thin film capacitors on dielectric substrates, typically oxidized silicon wafers. However, it is difficult to produce thin film capacitors of a precise, selected capacitance value. Therefore, it is desirable for a manufacturer to be able to finely adjust the capacitance value of the thin film capacitors during fabrication of the capacitors to achieve a capacitance value within a tighter tolerance than otherwise achievable during fabrication.

SUMMARY OF THE INVENTION

This invention provides for a method and apparatus for adjusting the capacitance value of thin film capacitors during fabrication to precisely produce a selected capacitance value. Multiple capacitors are fabricated to a capacitance value higher than the intended, final value for the capacitors by defining capacitor regions on a substrate, typically an oxidized silicon wafer, with oxide boundaries etched and oxidized into the substrate. Within the capacitor regions, capacitor dielectrics are formed by oxidizing the defined areas to the desired dielectric thicknesses. A thin film of metal is deposited onto the substrate and defined using photolithographic methods, and the metal film is etched such that the metal covers the dielectric areas and overlaps onto the surrounding oxide boundaries. During the same etching process, patterns comprised of several pairs of lines are etched from the metal film at selected areas outside of the capacitor regions. Each pair of pattern lines corresponds to a percentage change in the capacitance value of the fabricated capacitance regions. Therefore, the patterns provide a means for precisely reducing the capacitance value of the capacitance regions.

The capacitance regions are measured for capacitance value and are downwardly adjusted to produce the desired capacitance value for the capacitance regions by re-etching the metal film capacitor plates. The re-etching process is accomplished by selecting the desired pairs of lines of the adjustment patterns formed on the substrate corresponding to the desired percentage decrease in capacitance value. The selected pairs of lines are then offset aligned with the corresponding pairs of lines on the adjustment pattern of the photolithographic mask which was first used to etch the metal film and the adjustment patterns on the substrate. This offset alignment shifts the mask from its original position by an amount to cause portions of the metal areas comprising the capacitor plates to be exposed for re-etching. Re-etching removes the exposed portions of the capacitor plates and thus produces the selected decrease in the capacitance value of the capacitor regions by the selected amount.

DESCRIPTION OF THE DRAWINGS

The present invention will be more fully understood by referring to the following detailed description in conjunction with the accompanying drawings, of which:

FIG. 5 is a plan view of thin film capacitor regions formed on an oxidized silicon wafer after a four percent adjustment of their capacitance value in accordance with the invention;

FIG. 7A is a detailed plan view of a capacitance region formed on an oxidized silicon wafer after a two percent adjustment of capacitance value in accordance with the invention; and FIG. 7B is a detailed plan view of a capacitance region formed on an oxidized silicon wafer after a ten percent adjustment of capacitance value in accordance with the invention.

DETAILED DESCRIPTION OF THE INVENTION

Figure 1:
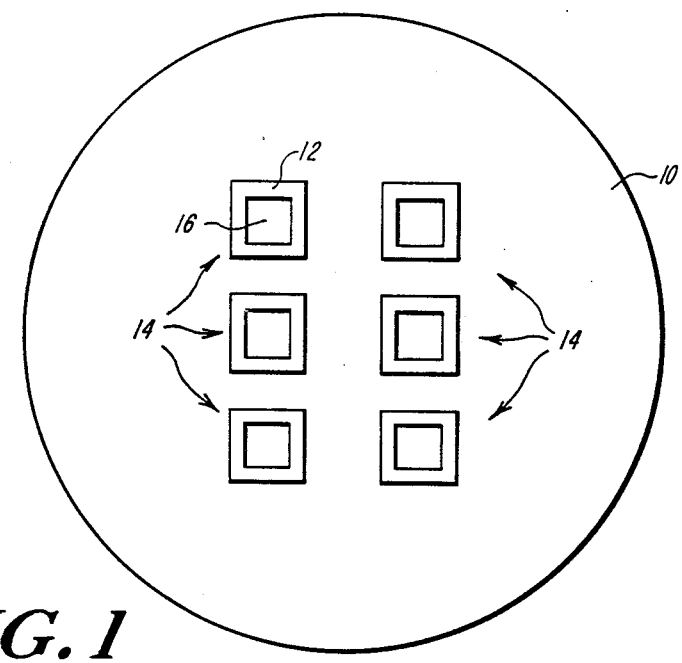
FIG. 1 is a plan view of one stage in the fabrication of thin film capacitors in accordance with the invention and shows an oxidized silicon wafer with capacitance regions defined by silicon oxide boundaries.
Figure 2:
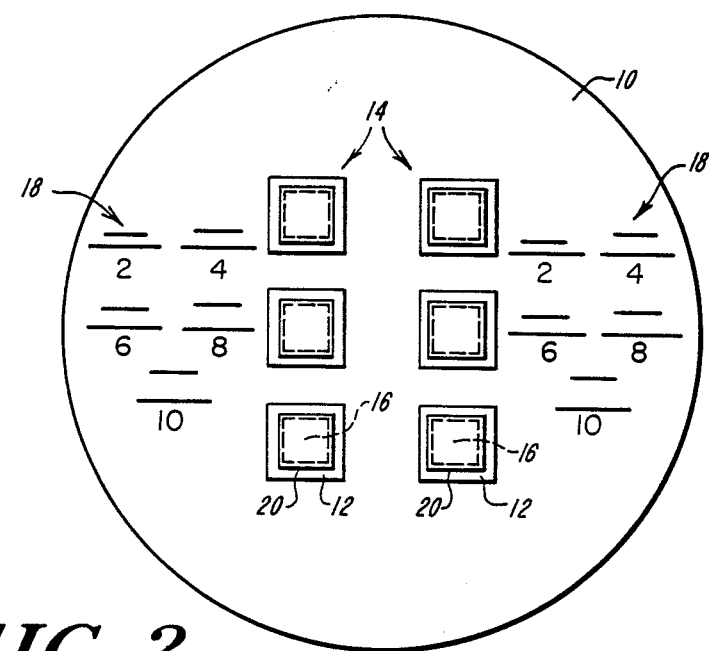
FIG. 2 is a plan view of a subsequent stage in the fabrication of thin film capacitors in accordance with the invention and shows capacitance regions formed on the oxidized silicon wafer and the metal areas and adjustment patterns formed after the first etching of the deposited metal film.
Figure 3:
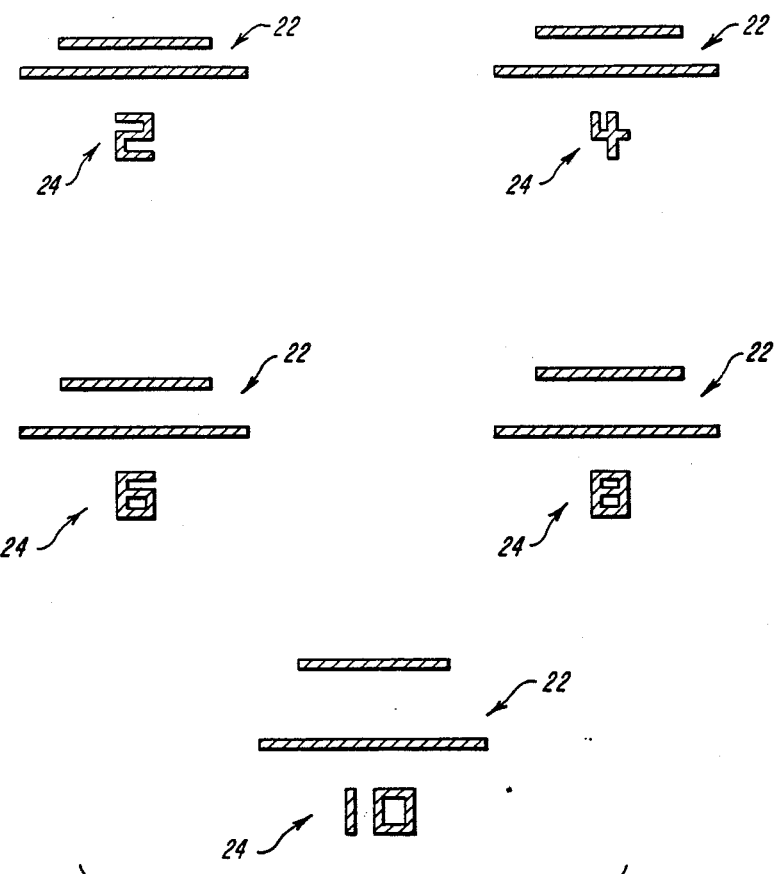
FIG. 3 is a detailed plan view of adjustment patterns formed on an oxidized silicon wafer in accordance with the invention.

Multiple capacitors are fabricated on a substrate, typically an oxidized silicon wafer, to a capacitance value higher than the intended, final value for the capacitors. Referring to FIG. 1, onto oxidized silicon wafer 10, oxide boundaries 12 are formed of silicon oxide. The oxide boundaries 12 serve to define capacitance regions, generally referred to as 14. The areas inside the oxide boundaries 12 are oxidized to a desired thickness to form silicon dioxide dielectrics 16. Referring now to FIG. 2, a thin film of metal, typically aluminum, is deposited onto oxidized silicon wafer 10. Using a mask having the adjustment patterns as shown in FIG. 3, photolithographic techniques well known to one skilled in the art are employed to etch the metal film leaving adjustment patterns 18 and capacitor plates 20. Capacitance plates 20 cover dielectrics 16 and overlap onto surrounding oxide boundaries 12.

As can be seen in FIG. 3, the adjustment patterns of the mask and the silicon wafer comprise several pairs of lines 22 spaced apart by different amounts corresponding to respective percentage decreases in the capacitance value of capacitor regions 14 of FIG. 2. Characters 24 indicate the adjustment percentage values for each pair of lines 22. For example, a "2" character indicates that the pair of lines 22 above the character are laterally spaced apart to produce a 2 percent reduction in capacitance value of capacitor regions 14 of FIG. 2 after offset alignment and re-etching described below. Likewise, a "4" character indicates that the pair of lines 22 above the character correspond to a 4 percent reduction of capacitance value of capacitor regions 14 after adjustment.

Figure 4:
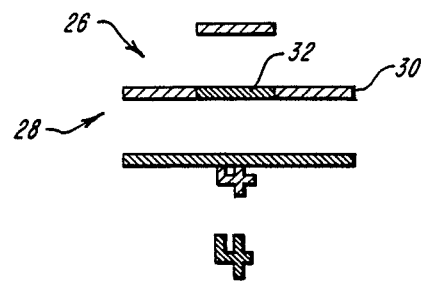
FIG. 4 is a greatly enlarged diagramatic representation of the offset alignment of the four percent adjustment pattern lines on an oxidized silicon wafer and a corresponding photolithographic mask which produces a four percent adjustment of capacitance value.

After etching of the metal layer, the capacitance value of the completed capacitance regions 14 of FIG. 2 is measured. The capacitance value of the capacitor regions are lowered to the intended, final value by re-etching metal capacitor plates 20 to reduce their area. To make the reduction, a percentage decrease in capacitance value is selected and the appropriate pair of lines 22 of adjustment patterns 18 of FIG. 3 are offset aligned with corresponding lines on the identical adjustment patterns on the photolithographic mask. Referring to FIG. 4, for example, to produce a four percent reduction in capacitance value, line pairs 26 and 28 of the adjustment patterns on the oxidized silicon wafer and the photolithographic mask respectively are preselected. Line pairs 26 and 28 correspond to a four percent reduction of capacitance value of the capacitors formed on the oxidized silicon wafer. Long line 30 of wafer adjustment pattern line pair 26 is matched with short line 32 of mask adjustment pattern line pair 28 to offset align wafer and mask adjustment pattern line pairs 26 and 28. This offset alignment shifts the pattern on the photolithographic mask to expose portions of capacitor plates 20 of FIG. 2 to re-etching.

The oxidized silicon wafer is re-etched, and as can be seen in FIG. 5, after re-etching the result is that the areas of capacitor plates 20 are reduced and portions 34 of dielectrics 16 are exposed and no longer confront capacitor plates 20. This reduction in the area of capacitor plates 20 correspondingly reduces the capacitance value of capacitor regions 14 to the desired value.

Figure 6A:
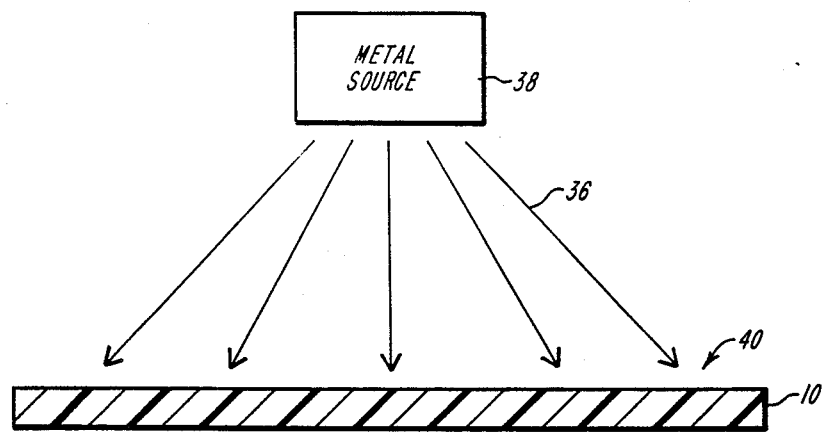
FIG. 6A is a diagramatic representation of the metal deposition process employed in accordance with the invention.
Figure 6B:
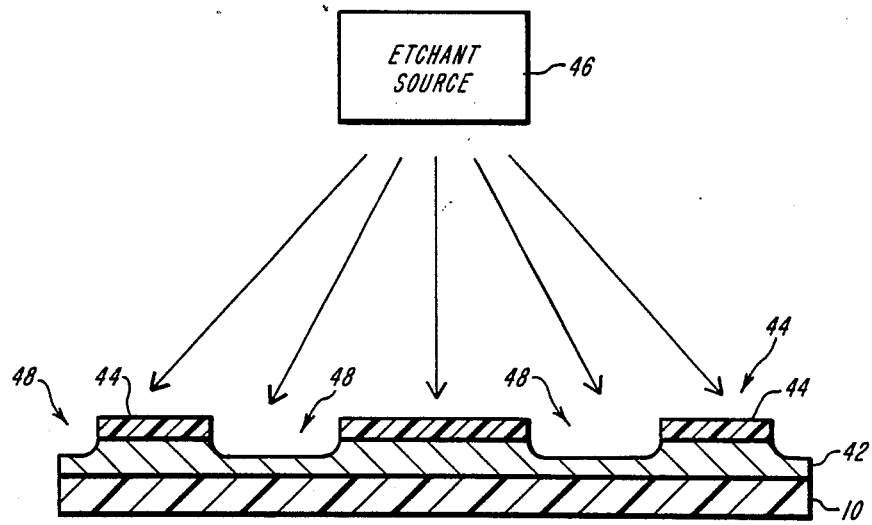
FIG. 6B is a diagramatic representation of both the etching and re-etching processes employed in accordance with the invention.

FIGS. 6A and 6B diagrammatically show the metal deposition, etching and re-etching processes. In the metal deposition process, FIG. 6A, metal 36, typically aluminum, from metal source 38 is deposited on surface 40 of oxidized silicon wafer 10. In the etching and re-etching processes, both shown in FIG. 6B, oxidized silicon wafer 10 with deposited metal layer 42 and photoresist layer 44, is exposed to etchant source 46. Etching source 46 removes portions 48 of metal layer 42 not protected by photoresist layer 44.

FIGS. 7A and 7B show detailed views of two capacitor regions formed on separate oxidized silicon wafers in accordance with the invention. In FIG. 7A, the original area of capacitor plate 50 has been reduced by re-etching in accordance with the invention to reduce the capacitance value of the capacitor region by two percent. This reduction in area of capacitor plate 50 results in portion 52 of dielectric 54 no longer being in confrontation with capacitor plate 50.

In FIG. 7B the original area of capacitor plate 56 has been reduced by re-etching in accordance with the invention to reduce the capacitance value of the capacitor region by 10 percent. This reduction results in portion 58 of dielectric 60 no longer being in confrontation with capacitor plate 56. A comparison of FIGS. 7A and 7B shows that for otherwise identical capacitor regions, a 10 percent reduction in capacitance value will produce a greater reduction in capacitor plate area than a two percent reduction in capacitance value, and will correspondingly leave a greater portion of dielectric 60 not confronting capacitor plate 56 than a two percent reduction in capacitance value.

The above description is given by way of example and is a preferred embodiment of the present invention. However, it will occur to those skilled in the art that modifications and alternatives can be practiced within the spirit of the invention. Accordingly, the scope of the present invention is limited only by the following claims.

What is claimed is:

1. A method for adjusting during fabrication the capacitance value of thin film capacitors formed on a substrate, comprising the steps of:

provdiing a first plurality of adjustment patterns on a mask which defines metallized capacitor plate areas of thin film capacitors;

using said mask to form said capacitor plate areas and a second plurality of adjustment patterns on the substrate;

aligning selected portions of said first plurality of adjustment patterns on said mask and said second plurality of adjustment patterns on said substrate to provide an intended offset between said mask-defined capacitor plate areas and said capacitor plate areas formed on the substrate, which offset defines portions of said capacitor plate areas formed on the substrate; and removing said offset-defined portions of said capacitor plate areas.

2. A method for adjusting during fabrication the capacitance value of thin film capacitors formed on a substrate, comprising the steps of:

providing a mask having areas defining a first plurality of adjustment patterns and areas defining metallized capacitor plate areas of thin film capacitors;

using said mask to form said capacitor plate areas on the substrate and simultaneously using said mask to form a second plurality of adjustment patterns on the substrate;

aligning selected portions of said first plurality of adjustment patterns on said mask and said second plurality of adjustment patterns on the substrate to provide a predetermined offset which defines selected portions of said metallized capacitor plate areas formed on the substrate; and removing said selected portions of said metallized capacitor plate areas.

* * * * *